United States Patent
Skupin et al.

(10) Patent No.: US 9,930,786 B2
(45) Date of Patent: Mar. 27, 2018

(54) DESMEAR MODULE OF A HORIZONTAL PROCESS LINE AND A METHOD FOR SEPARATION METHOD AND REMOVAL OF DESMEAR PARTICLES FROM SUCH A DESMEAR MODULE

(71) Applicant: Atotech Deutschland GmbH, Berlin (DE)

(72) Inventors: Andreas Skupin, Nürnberg (DE); Stefan Grüßner, Thalmässing (DE)

(73) Assignee: Atotech Deutschland GmbH, Berlin (DE)

( * ) Notice: Subject to any disclaimer, the term of this patent is extended or adjusted under 35 U.S.C. 154(b) by 0 days.

(21) Appl. No.: 15/515,357

(22) PCT Filed: Oct. 15, 2015

(86) PCT No.: PCT/EP2015/073833
§ 371 (c)(1),
(2) Date: Mar. 29, 2017

(87) PCT Pub. No.: WO2016/066431
PCT Pub. Date: May 6, 2016

(65) Prior Publication Data
US 2017/0231097 A1   Aug. 10, 2017

(30) Foreign Application Priority Data
Oct. 29, 2014   (EP) ..................... 14190815

(51) Int. Cl.
*C23F 1/00*   (2006.01)
*H05K 3/00*   (2006.01)
*B81C 1/00*   (2006.01)

(52) U.S. Cl.
CPC ......... *H05K 3/0055* (2013.01); *H05K 3/0088* (2013.01); *B81C 1/00539* (2013.01);
(Continued)

(58) Field of Classification Search
CPC ... H05K 2203/0796; H05K 2203/1545; H05K 3/00; H05K 3/0055; H05K 3/0088; B81C 1/00539; B05C 3/02
(Continued)

(56) References Cited

U.S. PATENT DOCUMENTS 4,911,802 A    3/1990  D'Ambrisi
5,520,205 A *  5/1996  Guldi ............... H01L 21/67051
                                                      134/102.1
(Continued)

FOREIGN PATENT DOCUMENTS

DE    3813518    11/1989
EP     251923     1/1988

OTHER PUBLICATIONS

PCT/EP2015/073833; PCT International Search Report and Written Opinion of the International Searching Authority dated Dec. 7, 2015.
(Continued)

*Primary Examiner* — Lan Vinh
(74) *Attorney, Agent, or Firm* — Renner, Otto, Boisselle & Sklar, LLP

(57) ABSTRACT

A desmear module for a horizontal galvanic or wet-chemical process line for metal, in particular copper, deposition on a substrate to be treated for a removal of precipitates comprising a desmear container connectable to a desmear unit, a pump and at least a first liquid connection element for connecting said pump with the desmear unit, wherein said pump is in conjunction with said desmear unit by said at least first liquid connection element; and wherein a treatment liquid level is provided inside the desmear module, which is above an intake area of the pump; wherein the desmear module further comprises at least a first liquid area, at least an adjacent second liquid area comprising the intake area of the pump, and at least a first separating element
(Continued)

arranged between said at least first liquid area and said at least second liquid area.

19 Claims, 5 Drawing Sheets

(52) U.S. Cl.
CPC ....... *H05K 3/00* (2013.01); *H05K 2203/0796* (2013.01); *H05K 2203/1545* (2013.01)

(58) Field of Classification Search
USPC ....... 134/111, 138, 135; 156/345.11, 345.22, 156/345.23; 216/83, 90
See application file for complete search history.

(56) References Cited

U.S. PATENT DOCUMENTS

| | | | |
|---|---|---|---|
| 2004/0262150 A1* | 12/2004 | Yajima | C25D 21/12 204/224 R |
| 2008/0124258 A1* | 5/2008 | Nakamura | B01J 19/006 423/50 |
| 2012/0298515 A1 | 11/2012 | Skupin et al. | |

OTHER PUBLICATIONS

PCT/EP2015/073833; PCT International Preliminary Report on Patentability dated Oct. 24, 2016.

\* cited by examiner

DESMEAR MODULE OF A HORIZONTAL PROCESS LINE AND A METHOD FOR SEPARATION METHOD AND REMOVAL OF DESMEAR PARTICLES FROM SUCH A DESMEAR MODULE

The present application is a U.S. National Stage Application based on and claiming benefit and priority under 35 U.S.C. § 371 of International Application No. PCT/EP2015/073833, filed 15 Oct. 2015, which in turn claims benefit of and priority to European Application No. 14190815.2 filed 29 Oct. 2014, the entirety of both of which is hereby incorporated herein by reference.

FIELD OF THE INVENTION

The present invention is directed to a desmear module for a horizontal galvanic or wet-chemical process line for metal, in particular copper, deposition on a substrate to be treated for a removal of precipitates comprising a desmear container being connectable to a desmear unit, a pump and at least a first liquid connection element for connecting said pump with the desmear unit, wherein said pump is in conjunction with said desmear unit by said at least first liquid connection element; and wherein a treatment liquid level is provided inside of the desmear module, which is above of an intake area of the pump.

The present invention is further related to a method for selective separation and subsequent removal of desmear particles from such a desmear module.

BACKGROUND OF THE INVENTION

Desmear chemicals, such as sodium or potassium permanganate, chromic acid or sulfuric acid are well known in the printed circuit board industry for cleaning of the drilled through-going conduits in the printed circuit board production. Especially, if sodium or potassium permanganate have been used for such a desmear cleaning procedure, there are generated large amounts of desmear particles by the chemical reaction of the desmear chemical with resin residues at the sites of the drilled through-going conduits of the printed circuit board.

Said generated desmear particles are in case of sodium or potassium permanganate manganese dioxide particles, which are known to agglomerate on the bottom of the respective desmear container of a desmear module.

However, it is often difficult to mechanically remove said desmear particles again from the bottom of the respective desmear container, in particular only by desmear liquid flow; and especially to remove them in a continuous manner during the horizontal processing of the respective substrates to be treated due to the high density of the suspension of manganese dioxide particles in the desmear treatment liquid.

There have been also attempts in the past to remove said manganese dioxide particles by a chemical reduction process by making use of suitable additional chemicals. But, the purpose of said invention has been to find a new and inventive mechanical solution for removing said desmear particles.

Attempts up to now to mechanically remove said desmear particles have only been partially successful and have been plagued with problems arising from the disadvantageous need to stop the entire horizontal processing line to allow a separate cleaning of the desmear container. Such a break leads to an increased interrupting time and to a loss of efficiency, which again leads to higher cost of such horizontal processing lines.

In order to alleviate this problem, there have been installed complex automatic cleaning procedures in the past in order to avoid interrupting the horizontal processing of the substrates to be treated due to maintenance issues. But, such solutions thus typically increase the cost and complexity of such horizontal processing lines.

In document DE3813518 A1 disclosed is a device for mechanically removing such desmear particles. Herein, a pair of nozzles, namely a pressure nozzle arranged directly above a drilled through-going conduit and a suction nozzle arranged directly below the same drilled through-going conduit, has been used for directly pressing desmear treatment liquid through the drilled through-going conduit, wherein the passing desmear treatment liquid comprising desmear particles of the respective drilled through-going conduit enters directly the suction nozzle. Thus, the desmear particles can be removed directly from the desmear module. But, such a solution has been only found suitable for thick printed circuit boards, which provide a sufficient inherent rigidity. The substrates to be treated in our days are much more challenging due to their reduced thickness and increased flexibility, which prevents the application of such a procedure.

Another problem encountered in common horizontal processing lines is the need of providing a large desmear container with a high desmear container volume, to avoid that desmear particles enter an intake area of a lower part of a required immersion pump. Thus, a large desmear treatment liquid volume has to be provided, which makes the process costly again.

Objective of the Present Invention

In view of the prior art, it was thus an object of the present invention to provide a desmear module for a horizontal process line, which does not exhibit the aforementioned shortcomings of desmear modules known in the art.

Further, it was an object of the present invention to provide a desmear module wherein the risk of entering the intake area of the lower part of the required immersion pump by desmear particles shall be minimized or preferably completely avoided.

In particular, it was an object of the present invention to provide a desmear module, which is able to prolong the lifetime of the desmear treatment liquid bath while at the same time the volume circulated of the desmear treatment liquid can be largely reduced.

Furthermore, it was an object to provide a desmear module for installation in horizontal processing lines already in operation at customer sites.

What is needed therefore is a desmear module, which is easily integrable in existing processing lines while requiring low space without being complex in design.

SUMMARY OF THE INVENTION

These objects are achieved by a desmear module having all features of claim 1. Appropriate modifications of the inventive desmear module are protected in dependent claims 2 to 14. Further, claim 15 comprises a method for selective separation and subsequent removal of desmear particles from such a desmear module.

The present invention accordingly provides a desmear module for a horizontal galvanic or wet-chemical process line for metal, in particular copper, deposition on a substrate to be treated for a removal of precipitates comprising a desmear container being connectable to a desmear unit, a pump and at least a first liquid connection element for connecting said pump with the desmear unit, wherein said pump is in conjunction with said desmear unit by said at least first liquid connection element; and wherein a treatment liquid level is provided inside of the desmear module, which is above of an intake area of the pump; wherein the desmear module further comprises at least a first liquid area, at least an adjacent second liquid area comprising the intake area of the pump, and at least a first separating element arranged between said at least first liquid area and said at least second liquid area.

It is thus possible to provide a desmear module, which does not exhibit the aforementioned shortcomings of the known prior art desmear modules.

Further, the risk of entering the intake area of the lower part of the required immersion pump by desmear particles is minimized or preferably completely avoided in the inventive desmear module.

The effective mechanical removal of desmear particles offered by the inventive desmear module ensures a higher product quality by avoiding circulating desmear particles together with the desmear treatment liquid by the required immersion pump on the surface of the subsequently processed substrate to be treated.

This offers the additional advantage that a smaller immersion pump can be chosen due to a lower required desmear treatment liquid volume delivery rate of said pump.

In particular, the inventive desmear module is able to prolong the lifetime of the desmear treatment liquid bath while at the same time the volume circulated of the desmear treatment liquid can be largely reduced. Commonly, a user needs a volume circulated about three to five times the volume of the desmear treatment liquid bath, which has to be constantly present inside of the respective desmear container. The desmear module of the present invention requires only about 10 to 50 volume percent of the desmear treatment liquid bath. Thus, the economic gain of the inventive desmear module is tremendous.

Furthermore, the inventive desmear module offers the advantage that the amended desmear module can be easily installed in horizontal processing lines already in operation at customer sites while requiring low space and without being complex in design.

BRIEF DESCRIPTION OF THE FIGURES

For a more complete understanding of the present invention, reference is made to the following Detailed Description of the Invention considered in conjunction with the accompanying figures, in which:

FIG. 3 exhibits a desmear module in accordance with a third embodiment of the present invention, which is based on the first embodiment of the present invention shown in FIG. 1a.

DETAILED DESCRIPTION OF THE INVENTION

Figure 1A:
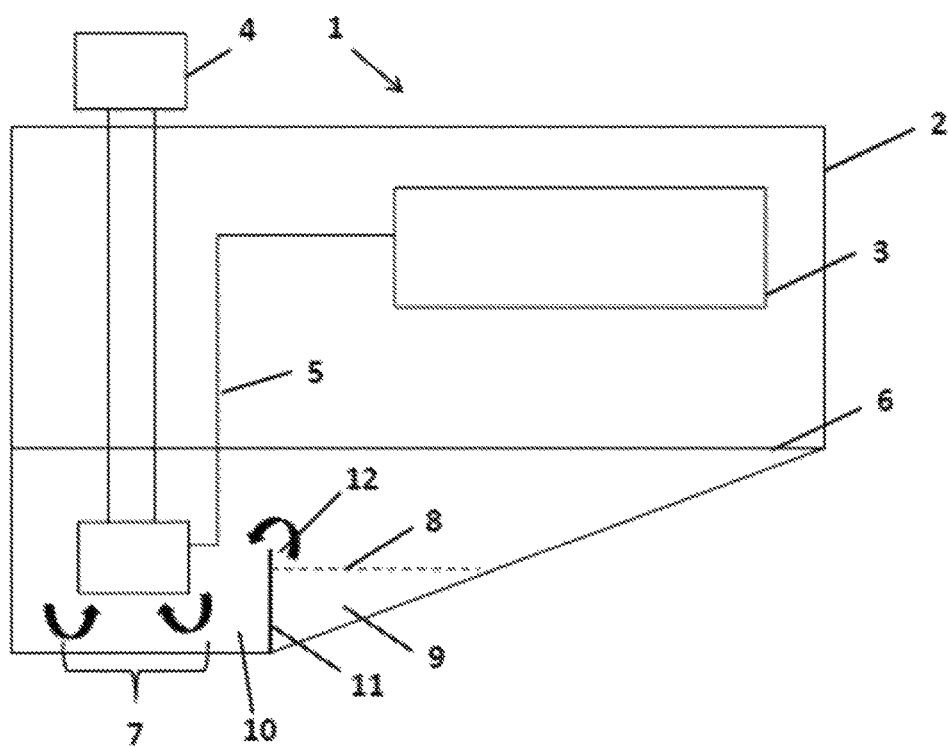
FIG. 1a and FIG. 1b exhibit a desmear module in accordance with a first embodiment of the present invention.

As used herein, the term "desmear module", when applied in accordance with the present invention, refers to any horizontal processing module, which is able to allow a desmear process step taking place inside it in order to remove smear from the drillings of the through-going conduits in substrates to be treated.

As used herein, the term "horizontal galvanic or wet-chemical process line for metal deposition", when applied in accordance with the present invention, refers to any kind of horizontal process, wherein a metal will be deposited on a substrate to be treated during a galvanic and/or wet-chemical process.

As used herein, the term "desmear unit", when applied in accordance with the present invention, refers to a module of a common horizontal process line, wherein desmear treatment liquid will be applied by flooding device elements, each directing a flow of desmear treatment liquid to one or both surfaces of the substrate to be treated, to remove residual smear of the raw material of the substrate to be treated out of the drilled through-going conduits. After rinsing of said drilled through-going conduits a slurry of desmear treatment liquid and removed desmear particles will flow out of said desmear unit to be collected in the first liquid area of the desmear container.

Such a desmear unit can be arranged inside or outside of a desmear container.

If the desmear unit is located inside of the desmear container, the desmear unit is arranged at higher level than the treatment liquid level inside of the desmear module. The slurry will then flow directly in the first liquid area of the desmear module.

If the desmear unit is located outside of the desmear container, a third liquid connection element has to be comprised for conducting the slurry from the desmear unit to the desmear container of the desmear module. This has to be executed in such a manner that the slurry will finally also reach the first liquid area of the desmear module.

It can be preferred to make use of an immersion pump, wherein the lower part of the immersion pump comprising the intake area of the immersion pump is arranged directly in the second liquid area of the desmear module at lower level than the treatment liquid level inside of the desmear container. The upper part of the immersion pump will be arranged outside of the desmear container of the desmear module.

It can alternatively be preferred to make use of a centrifugal pump, which is arranged outside of the desmear container of the desmear module. Thus, a fourth liquid connection element for connecting the intake area inside of the second liquid area of the desmear module with the centrifugal pump has to be additionally comprised. Said fourth liquid connection element conducts the treatment liquid first to the centrifugal pump before the treatment liquid will subsequently be forwarded by the first liquid connection element to a desmear unit.

At the maximum, the intake area can be identical to the second liquid area of the desmear module.

As used herein, the term "metal", when applied in accordance with the present invention, refers to metals which are known to be generally suitable for a galvanic or wet-chemical metal deposition process. Such metals can in particular comprise gold, nickel, and copper, preferably copper.

As used herein, the "substrate to be treated" is round, preferably circular, or angular, preferably polyangular, such as rectangular, quadratic or triangular, or a mixture of round and angular structure elements, such as semicircular; and/or the substrate to be treated has a diameter ranging from 50 mm to 1000 mm, preferably from 100 mm to 700 mm, and more preferably from 120 mm to 500 mm, in case of a round structure; or a side length ranging from 10 mm to 1000 mm, preferably from 25 mm to 700 mm, and more preferably from 50 mm to 500 mm, in case of an angular, preferably polyangular, structure and/or the substrate to be treated is a printed circuit board, a printed circuit foil, a semiconductor wafer, a wafer, a solar cell, a photoelectric cell, a flat panel display or a monitor cell. The flat substrate to be treated can be composed of one material or of a mixture of different materials, such as glass, plastics, molded compounds or ceramics.

In a preferred embodiment, the flat substrate can be an endless substrate in form of an endless conveyor, which is processed continuously through the entire horizontal apparatus. In this case, the flat substrate is composed of a flexible material, which allows winding up coils of the original material before the processing and winding in coils of the final material after processing.

It has generally to be ensured that a sufficient volume flow of treatment liquid is provided to the intake area of the pump in order to keep the treatment liquid circulation from the desmear container to the desmear unit and back alive. Preferably, a treatment liquid level monitoring system can be applied for this purpose.

As used herein, the term "treatment liquid", when applied in accordance with the present invention, refers to a desmear treatment liquid, which has been commonly found to be suitable for executing a desmear process, preferably sodium or potassium permanganate.

In a first embodiment, the first separating element is a non-permeable liquid weir being arranged below the treatment liquid level inside of the desmear module comprising an overflow edge to allow treatment liquid to flow from the first liquid area to the second liquid area.

It is ensured by the overflow edge that sufficient treatment liquid reaches the second liquid area in order to keep the pump running. On the other hand, desmear particles can be kept in the first liquid area in front of the first separating element. Thus, the desmear particles cannot reach the intake area of the pump, wherein the desmear particles can be transported back to the desmear unit and therein pollute the surface of the subsequently processed substrate. This can be completely avoided by the overflow edge.

In the first embodiment, it can be preferred that the desmear module further comprises at least a second separating element, preferably identical to the first separating element, which is arranged in a parallel manner to the first separating element.

In the first embodiment, it is especially preferred that the desmear module comprises at least a first and a second separating element having different absolute heights of the respective overflow edge, preferably with increasing heights from the first liquid area to the second liquid area.

Such plurality of separating elements offers the advantage that desmear particles can be prevented from passing the overflow edge of the separating element(s) in an efficient manner. The desmear particles are accumulating in the first liquid area. Due to their high density the desmear particles, in particular in case of $MnO_2$, sink relatively fast to the respective bottom of the desmear container in front of the separating elements. The desmear module can be adapted to the desmear particle sizes being generated in the desmear unit of a horizontal process line by providing different absolute heights of the overflow edges of the respective separating elements. So, even when desmear particles overflow the first separating element, they can be still collected by accumulation in front of the second separating element.

Especially, when the second separating element possesses an increased absolute height, which is higher than the first separating element, the desmear particles can be efficiently prevented from flowing over all respective separating elements to reach the second liquid area of the desmear module.

In a second embodiment, the first separating element is a permeable liquid weir going from the bottom of the desmear container up to an absolute height above the treatment liquid level inside of the desmear module.

However, the second embodiment also ensures that sufficient treatment liquid reaches the second liquid area by allowing treatment liquid to flow through the permeable separating element(s) instead of flowing over an overflow edge as in the first embodiment.

Both embodiment ensures that enough volume of treatment liquid can reach the second liquid area of the desmear module in order to keep the pump running.

In the second embodiment, it can be preferred that the desmear module further comprises at least a second separating element, preferably identical to the first separating element, which is arranged in a parallel manner to the first separating element.

By arranging a plurality of parallel permeable liquid weirs, the desmear module can again be adapted to the size of desmear particles being generated in the respective desmear unit, which are still allowed to pass the permeable liquid weir as separating element.

The respective desmear module can be controlled and/or regulated in dependence of process line conditions and materials by modifying the permeable liquid weirs as separating elements.

In the second embodiment, it can be preferred that the desmear module comprises at least a first and/or at least a first and a second separating element each having a plurality of openings, pores, through-going conduits and/or gaps.

This offers the possibility to choose different desmear particle sizes allowed to pass in dependence of the specific individual separating element.

In the second embodiment, it is especially preferred that the plurality of openings, pores, through-going conduits and/or gaps have a homogenous or nonhomogeneous distribution in the at least first and/or second separating element, preferably a nonhomogeneous distribution.

In the second embodiment, the plurality of openings, pores, through-going conduits and/or gaps in each separating element can have equal and/or unequal average; wherein said openings, pores, through-going conduits and/or gaps comprise a round, preferably circular cross section, or angular, preferably polyangular, cross section, such as rectangular, quadratic or triangular; or a cross section formed by a mixture of round and angular structure elements, such as semicircular.

In the second embodiment, the average diameter of said openings, pores, through-going conduits and/or gaps in each separating element can continuously increase or decrease, preferably increase, from the bottom of the desmear container up to the absolute height above the treatment liquid level inside of the desmear module.

In all embodiments, it can be preferred that a bottom wall of the desmear container is subdivided in two parts, namely a first bottom wall part in the first liquid area and a second bottom wall part in the second liquid area, wherein the transition point between said bottom wall parts is below the at least first separating element; wherein both bottom wall parts can run straight horizontally or at least one of both bottom wall parts runs at least partially inclined upwards or downwards related to the horizontal.

If the first bottom wall part runs at least partially inclined upwards from a position close or identical to the transition point to the end of the first bottom wall part, less desmear treatment volume liquid has to be used in the desmear container. This saves cost and chemicals.

If the first bottom wall part runs at least partially inclined downwards from a position close or identical to the transition point to the end of the first bottom wall part, less desmear particles flow in direction of the separating element and the pump. This reduces the risk that desmear particles reach the second liquid area before they have been accumulated on the bottom of the desmear container in front of the respective first separating element.

It can be especially preferred that the first bottom wall part comprises in front of the at least first separating element at least a first cavity for accumulating desmear particles, wherein the bottom of said at least first cavity comprises a treatment liquid outlet for removing said desmear particles out of the desmear container.

The cavity advantageously offers that desmear particles, preferably $MnO_2$ particles, can be accumulated inside of the cavity in front of the first separating element. The subsequent removal of said desmear particles is more efficient than without using such a cavity, wherein the desmear particles become distributed on a large area of the first bottom wall part instead of selectively accumulating in such a cavity.

In one embodiment, the desmear module further comprises at least a first treatment liquid circulation system, wherein said first treatment liquid circulation system comprises at least a second liquid connection element going from a treatment liquid outlet arranged in front of the at least first separating element in the first liquid area for removing desmear particles out of the desmear container to a first filter device having a coarse filter unit, wherein the desmear particles are separated from the filtrate, wherein said second liquid connection element is subsequently going further to the second liquid area of the desmear container.

Alternatively, a cyclone cascade can be used for this purpose.

Less and smaller desmear particles can reach the second liquid area, if such a coarse filter unit is applied. Thus, a subsequent pollution of the subsequent processed substrate to be treated in the desmear unit by forwarded desmear particles can be avoided.

As coarse filter unit, an edge split filter, preferably a self-cleaning one, is applied, which preferably offers a filtering capacity down to 25 micrometers instead to 40 micrometer as with stainless steel filter units.

The coarse filter unit provides a final particle size distribution of the residual desmear particles ranging from 15 to 70 micrometer, preferably from 20 to 60 micrometer, and more preferably from 25 to 50 micrometer.

In one embodiment, the desmear module further comprises at least a second treatment liquid circulation system, wherein said second treatment liquid circulation system comprises at least the first liquid connection element, wherein a second filter device having a fine filter unit is interconnected.

Such a second filter device which has a finer filter unit allows to even remove residual small desmear particles, which could not be removed by the first filter device having the coarse filter unit. Thus, a kind of filter series can be advantageously applied in the inventive desmear module in order to remove the main part, or ideally all, of disturbing desmear particles out of the circulating treatment liquid.

In a third embodiment, the present invention is related to a desmear module for a horizontal galvanic or wet-chemical process line for metal, in particular copper, deposition on a substrate to be treated for a removal of precipitates comprising a desmear container being connectable to a desmear unit, an immersion pump and at least a first liquid connection element for connecting said immersion pump with the desmear unit, wherein the immersion pump is in conjunction with said desmear unit by said at least first liquid connection element; and wherein a treatment liquid level is provided inside of the desmear module, which is below of the desmear unit and above of an intake area of a lower part of the immersion pump; wherein the desmear module further comprises at least a first liquid area arranged below the desmear unit, at least an adjacent second liquid area comprising the lower part of the immersion pump; and at least a non-permeable liquid weir as first separating element arranged between said at least first liquid area and said at least second liquid area.

In the third embodiment, the non-permeable liquid weir is being arranged below the treatment liquid level inside of the desmear module comprising an overflow edge to allow treatment liquid to flow from the first liquid area to the second liquid area.

The desmear module of the third embodiment comprises further that a bottom wall of the desmear container is subdivided in two parts, namely a first bottom wall part in the first liquid area and a second bottom wall part in the second liquid area, wherein the transition point between said bottom wall parts is below the at least first separating element; wherein both bottom wall parts can run straight horizontally or at least one of both bottom wall parts runs at least partially inclined upwards or downwards related to the horizontal.

In the third embodiment, the first bottom wall part comprises in front of the at least first separating element at least a first cavity for accumulating desmear particles, wherein the bottom of said at least first cavity comprises a treatment liquid outlet for removing said desmear particles out of the desmear container.

The third embodiment comprises further at least a first treatment liquid circulation system, wherein said first treatment liquid circulation system comprises at least a second liquid connection element going from a treatment liquid outlet arranged in front of the at least first separating element in the first liquid area for removing desmear particles out of the desmear container to a first filter device having a coarse filter unit, wherein the desmear particles are separated from the filtrate, wherein said second liquid connection element is subsequently going further to the second liquid area of the desmear container; and further comprises at least a second treatment liquid circulation system, wherein said second treatment liquid circulation system comprises at least the first liquid connection element, wherein a second filter device having a fine filter unit is interconnected.

Further, the present invention also relates to a method for selective separation and subsequent removal of desmear particles from a desmear module characterized by the following method steps:

i) Providing such an inventive desmear module of a horizontal galvanic or wet-chemical process line as described above.

ii) Selective separation of desmear particles from the bottom of the desmear container in front of the at least first separating element by allowing the desmear particles to accumulate there over time.

iii) Removal of the collected desmear particles by conveying solution through a filter device having at least a coarse filter unit.

iv) Conducting the filtered treatment liquid from the filter device back to the desmear container.

The present invention according to above method thus addresses the problem of prolonging the lifetime of the desmear treatment liquid bath. Also, the volume circulated of the desmear treatment liquid can be largely reduced. Especially, the application of sodium or potassium permanganate as desmear treatment liquid, which leads to $MnO_2$ desmear particles, can be advantageously executed by the inventive desmear module of the present invention.

Turning now to the Figures, FIG. 1a shows a first embodiment of the present invention, wherein a desmear module 1 of a horizontal galvanic or wet-chemical process line for metal, in particular copper, deposition on a substrate to be treated comprises a desmear container 2, a desmear unit 3, an immersion pump 4 and a first liquid connection element 5 going from said immersion pump 4 to the desmear unit 3.

The immersion pump 4 is in conjunction with said desmear unit 3 by said first liquid connection element 5.

A treatment liquid level 6 is provided inside of the desmear module 1, which is below of the desmear unit 3 and above of an intake area 7 of a lower part of the immersion pump 4.

The desmear module 1 further comprises a first liquid area 9 arranged below the desmear unit 3, an adjacent second liquid area 10 comprising the lower part of the immersion pump 4, and a first separating element 11 arranged between said first liquid area 9 and said second liquid area 10.

In this first embodiment of the present invention, the first separating element 11 is a non-permeable liquid weir being arranged below the treatment liquid level 6 inside of the desmear module 1 comprising an overflow edge 12 to allow treatment liquid to flow from the first liquid area 9 to the second liquid area 10.

Further, the bottom wall of the desmear container 2 is subdivided in two parts, namely a first bottom wall part in the first liquid area 9 and a second bottom wall part in the second liquid area 10, wherein the transition point between said bottom wall parts is below the first separating element 11. The second bottom wall runs herein straight horizontally, while the first bottom wall runs inclined upwards related to the horizontal.

A slurry liquid level 8 of the suspension of desmear particles, in particular $MnO_2$ particles, in treatment liquid is shown exclusively in the first liquid area 9 leading to a slurry free second liquid area 10. The slurry liquid level 8 stays below the overflow edge 12, so that there is no risk that desmear particles can reach the intake are 7 of the immersion pump 4.

Figure 1B:
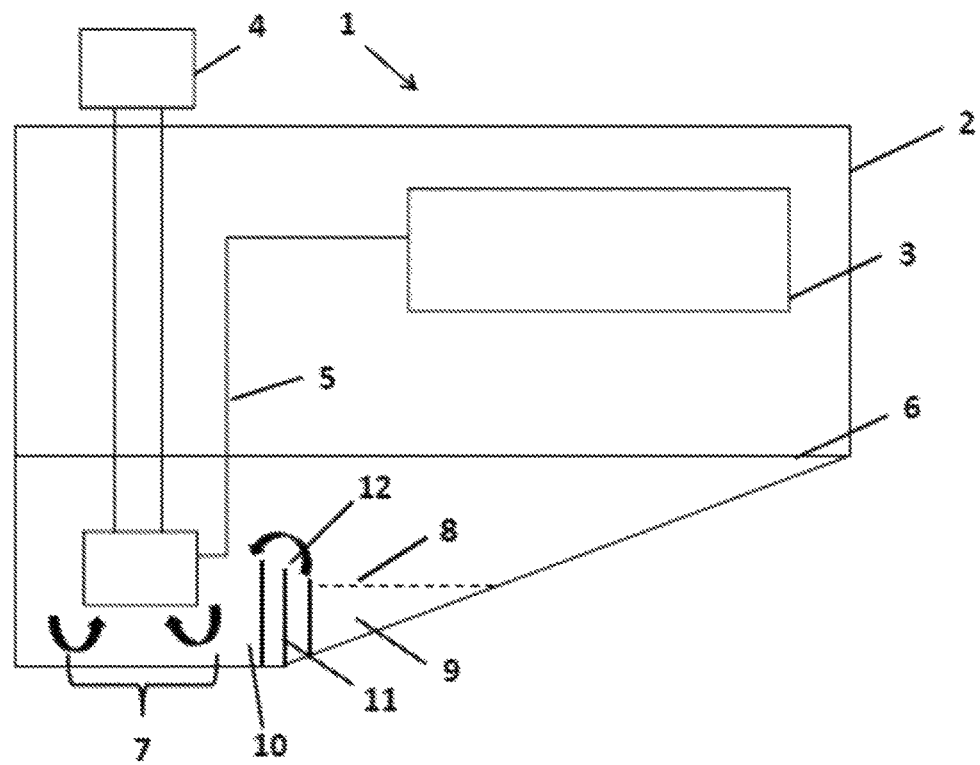

FIG. 1b shows a slightly modified first embodiment, wherein the desmear module 1 further comprises a second separating element being identical to the first separating element 11, which is arranged in a parallel manner to the first separating element 11. Herein, the desmear module 1 comprises a first 11 and a second separating element having different absolute heights of the respective overflow edge 12 with increasing heights from the first liquid area 9 to the second liquid area 10.

This modification reduces further the risk that desmear particles can reach the second liquid area 10.

Figure 2A:
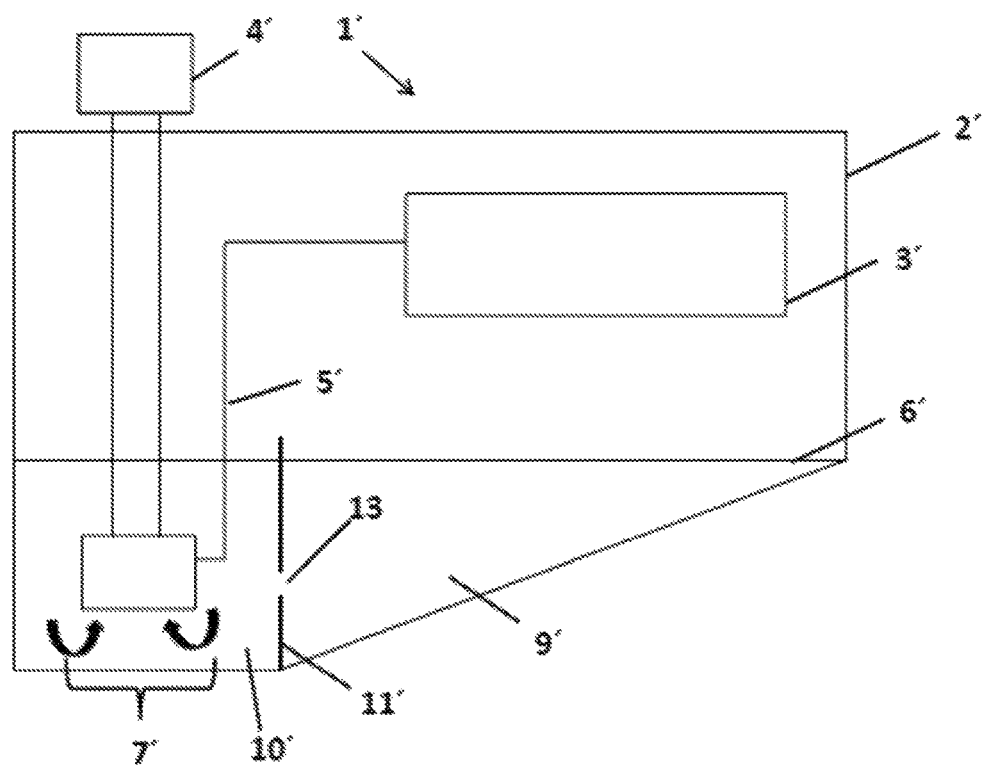
FIG. 2a and FIG. 2b exhibit a desmear module in accordance with a second embodiment of the present invention.

FIG. 2a shows a second embodiment of the present invention, wherein a desmear module 1" of a horizontal galvanic or wet-chemical process line for metal, in particular copper, deposition on a substrate to be treated comprises a desmear container 2", a desmear unit 3", an immersion pump 4" and a first liquid connection element 5" going from said immersion pump 4" to the desmear unit 3".

The immersion pump 4" is in conjunction with said desmear unit 3" by said first liquid connection element 5".

A treatment liquid level 6" is again provided inside of the desmear module 1", which is below of the desmear unit 3" and above of an intake area 7" of a lower part of the immersion pump 4".

The desmear module 1" further comprises a first liquid area 9" arranged below the desmear unit 3", an adjacent second liquid area 10" comprising the lower part of the immersion pump 4", and a first separating element 11" arranged between said first liquid area 9" and said second liquid area 10".

In contrast to the first embodiment, the second embodiment of the present invention comprises that the first separating element 11" is a permeable liquid weir going from the bottom of the desmear container 2" up to an absolute height above the treatment liquid level 6" inside of the desmear module 1".

Said first separating element 11" possesses herein a single gap or opening 13 in order to allow treatment liquid, but not desmear particles, to reach the second liquid area 10'.

Figure 2B:
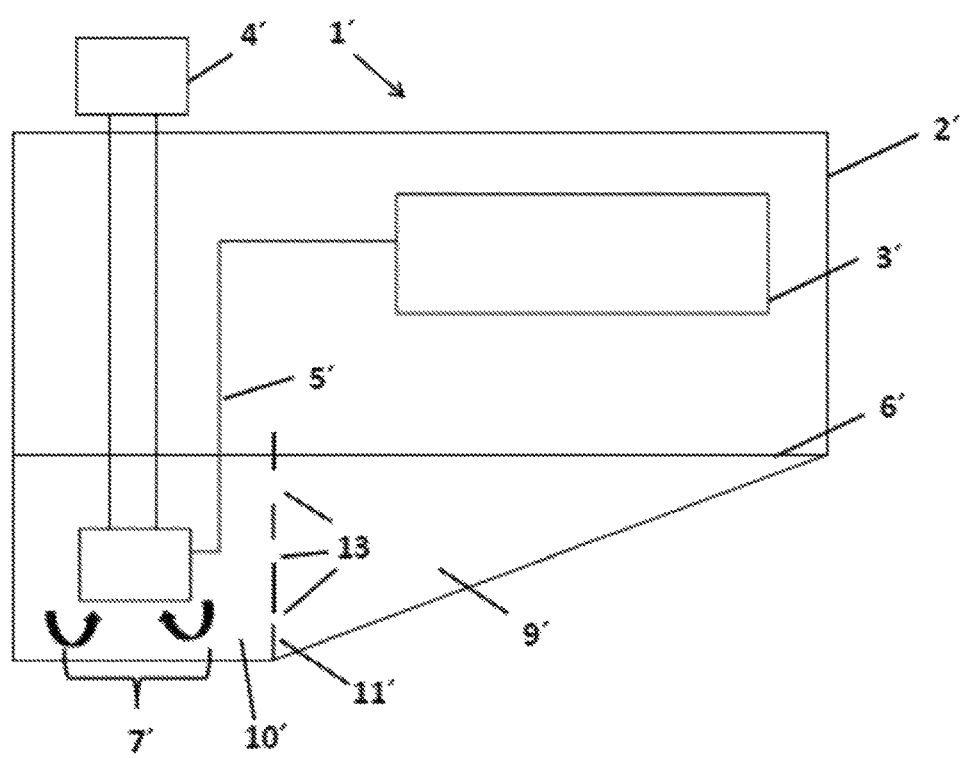

A slurry liquid level of suspended desmear particles, in particular $MnO_2$ particles, in treatment liquid is not shown in FIG. 2a or 2b. Said slurry liquid level can in principle be identical to the treatment liquid level 6". All desmear particles can only be found in the first liquid area 9", wherein all desmear particles shall accumulate at the bottom of the desmear container 2", but in front of the first separating element 11". The position of the gap 13 has to be carefully chosen in dependence of the applied horizontal process system to avoid desmear particles passing through said gap 13.

Further, the bottom wall of the desmear container 2" is subdivided in two parts, namely a first bottom wall part in the first liquid area 9" and a second bottom wall part in the second liquid area 10", wherein the transition point between said bottom wall parts is below the first separating element 11". The second bottom wall runs herein straight horizontally, while the first bottom wall runs inclined upwards related to the horizontal.

FIG. 2b shows a slightly modified second embodiment, wherein the desmear module 1" comprises a first 11" separating element having a plurality of openings, pores, through-going conduits and/or gaps 13, wherein the average diameter of said openings, pores, through-going conduits and/or gaps 13 in the first separating element 11" is continuously increasing from the bottom of the desmear container 2" up to the absolute height above the treatment liquid level 6" inside of the desmear module 1".

This offers the advantage that the biggest desmear particles, which will accumulate on the surface of the bottom of the desmear container first, cannot pass the relatively small openings, pores, through-going conduits and/or gaps 13.

Figure 3:
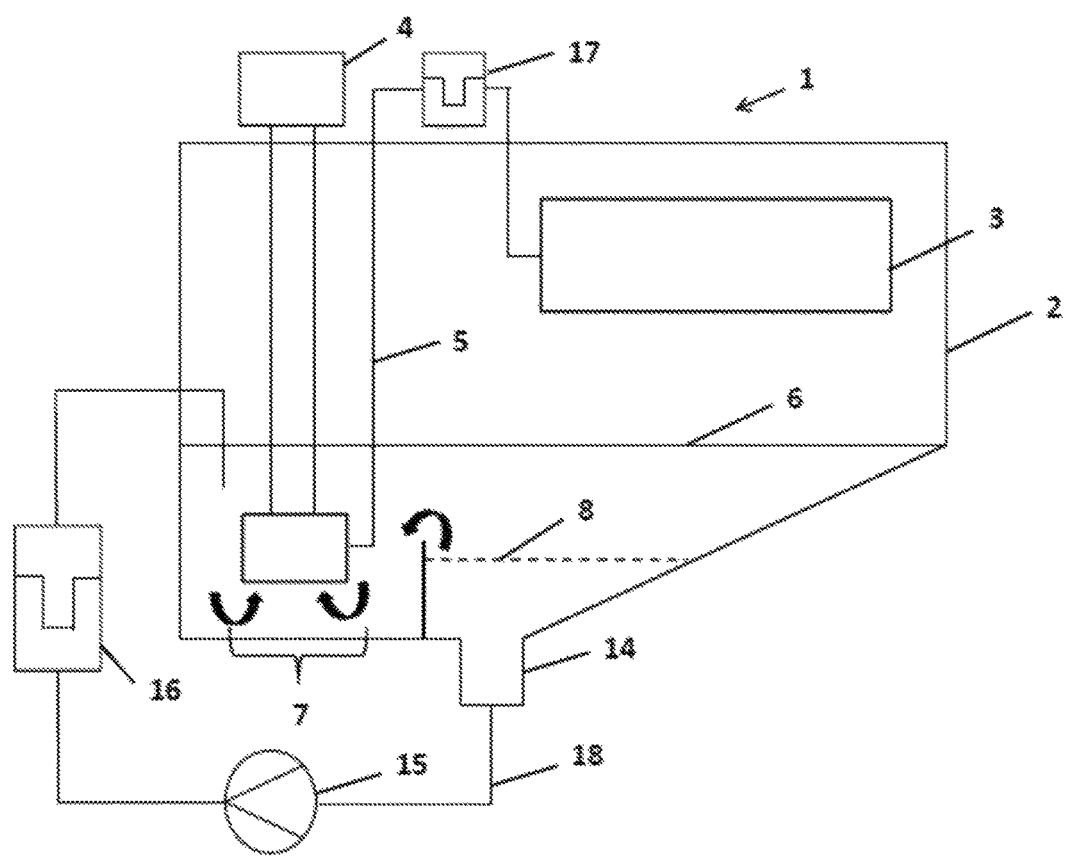

Finally, FIG. 3 shows a third embodiment of a desmear module of the present invention, which is mainly based on the first embodiment shown in FIG. 1a. The desmear module 1 of FIG. 3 comprises also a first liquid area, a second liquid area, a first separating element and an overflow edge, even if these technical features have not been marked by the respective reference signs 9, 10, 11, and 12. Said reference signs are only not shown for providing a higher clarity of the FIG. 3 itself.

The entire FIG. 1a description, in particular the description of the technical features marked by the reference signs 1 to 8, are intended to be disclosed and included herein as well, even when the respective FIG. 1a description has not been outlined again to avoid unnecessary repetition.

Additional to the first embodiment of FIG. 1a, FIG. 3 exhibits that the first bottom wall part comprises in front of the first separating element a first cavity 14 for accumulating desmear particles, wherein the bottom of said first cavity 14 comprises a treatment liquid outlet for removing said desmear particles out of the desmear container 2.

Herein, the first bottom wall part in the first liquid area runs first straight horizontally until it reaches the first wall of the first cavity 14, and second continuous running from the other wall of the first cavity 14 inclined upwards related to the horizontal.

The desmear module 1 of FIG. 3 comprises further a first treatment liquid circulation system comprising a second liquid connection element 18 going from a treatment liquid outlet at the bottom of the first cavity 14, which is arranged in front of the first separating element in the first liquid area, to a first filter device 16 having a coarse filter unit. A slurry pump 15 has been used for delivering the slurry of desmear particles suspended in treatment liquid from the bottom of the cavity 14 to the coarse filter unit of the first filter device 16.

Herein, the desmear particles become separated from the filtrate. The second liquid connection element 18 is subsequently going further to the second liquid area of the desmear container 2.

FIG. 3 additionally exhibits a second treatment liquid circulation system comprising the first liquid connection element 5, wherein a second filter device 17 having a fine filter unit is interconnected.

While the principles of the invention have been explained in relation to certain particular embodiments, and are provided for purposes of illustration, it is to be understood that various modifications thereof will become apparent to those skilled in the art upon reading the specification. Therefore, it is to be understood that the invention disclosed herein is intended to cover such modifications as fall within the scope of the appended claims. The scope of the invention is limited only by the scope of the appended claims.

REFERENCE SIGNS 1, 1" Desmear module
2, 2" Desmear container
3, 3" Desmear unit
4, 4" Immersion pump
5, 5" First liquid connection element
6, 6" Treatment liquid level
7, 7" Intake area of a lower part of the immersion pump
8, 8" Slurry liquid level
9, 9" First liquid area
10, 10" Second liquid area
11, 11" First separating element
12 Overflow edge
13 Openings, pores, through-going conduits and/or gaps
14 First cavity in a first bottom wall part
15 Slurry pump
16 First filter device
17 Second filter device
18 Second liquid connection element.

The invention claimed is:

1. Desmear module for a horizontal galvanic or wet-chemical process line for metal deposition on a substrate to be treated for a removal of precipitates comprising a desmear container being connectable to a desmear unit, a pump and at least a first liquid connection element for connecting said pump with the desmear unit, wherein said pump is in conjunction with said desmear unit by said at least first liquid connection element; and wherein a treatment liquid level is provided inside of the desmear module, which is above of an intake area of the pump characterized in that the desmear module further comprises at least a first liquid area, at least an adjacent second liquid area comprising the intake area of the pump, and at least a first separating element arranged between said at least first liquid area and said at least second liquid area, wherein the first separating element is a non-permeable liquid weir being arranged below the treatment liquid level inside of the desmear module comprising an overflow edge to allow treatment liquid to flow from the first liquid area to the second liquid area or wherein the first separating element is a permeable liquid weir going from the bottom of the desmear container up to an absolute height above the treatment liquid level inside of the desmear module, wherein the term desmear module refers to a horizontal processing module being able to allow a desmear process step taking place inside it in order to remove smear from the drillings of the through-going conduits in substrates to be treated, wherein the term desmear unit refers to a module of a horizontal process line containing flooding device elements, each adapted to direct a flow of desmear treatment liquid to one or both surfaces of the substrate to be treated, to remove residual smear of the raw material of the substrate to be treated out of the drilled though-going conduits.

2. Desmear module according to claim 1 characterized in that the desmear module is for a horizontal galvanic or horizontal wet-chemical process line for copper deposition.

3. Method for selective separation and subsequent removal of desmear particles from a desmear module characterized by the following method steps:

i) Providing a desmear module of a horizontal galvanic or wet-chemical process line according to claim 1;

ii) Selective separation of desmear particles from the bottom of the desmear container in front of the at least first separating element by allowing the desmear particles to accumulate there over time;

iii) Removal of the collected desmear particles by conveying solution through a filter device having at least a coarse filter unit;

iv) Conducting the filtered treatment liquid from the filter device back to the desmear container.

4. Desmear module according to claim 1 characterized in that the desmear module further comprises at least a second separating element which is arranged in a parallel manner to the first separating element.

5. Desmear module according to claim 4 characterized in that the desmear module comprises at least a first and a second separating element having different absolute heights of the respective overflow edge.

6. Desmear module according to claim 1 characterized in that a bottom wall of the desmear container is subdivided in two parts, namely a first bottom wall part in the first liquid area and a second bottom wall part in the second liquid area, wherein the transition point between said bottom wall parts is below the at least first separating element; wherein both bottom wall parts can run straight horizontally or at least one of both bottom wall parts runs at least partially inclined upwards or downwards related to the horizontal.

7. Desmear module according to claim 6 characterized in that the first bottom wall part comprises in front of the at least first separating element at least a first cavity for accumulating desmear particles, wherein the bottom of said at least first cavity comprises a treatment liquid outlet for removing said desmear particles out of the desmear container.

8. Desmear module according to claim 1 characterized in that the desmear module further comprises at least a first treatment liquid circulation system, wherein said first treatment liquid circulation system comprises at least a second liquid connection element going from a treatment liquid outlet arranged in front of the at least first separating element in the first liquid area for removing desmear particles out of the desmear container to a first filter device having a coarse filter unit, wherein the desmear particles are separated from the filtrate, wherein said second liquid connection element is subsequently going further to the second liquid area of the desmear container.

9. Desmear module according to claim 8 characterized in that the desmear module further comprises at least a second treatment liquid circulation system, wherein said second treatment liquid circulation system comprises at least the first liquid connection element, wherein a second filter device having a fine filter unit is interconnected.

10. Desmear module according to claim 1 characterized in that the desmear module further comprises at least a second separating element which is arranged in a parallel manner to the first separating element.

11. Desmear module according to claim 10 characterized in that the desmear module comprises at least a first and/or at least a first and a second separating element each having a plurality of openings, pores, through-going conduits and/or gaps.

12. Desmear module according to claim 11 characterized in that the plurality of openings, pores, through-going conduits and/or gaps have a nonhomogeneous distribution in the at least first and/or second separating element.

13. Desmear module according to claim 11 characterized in that the plurality of openings, pores, through-going conduits and/or gaps in each separating element have equal and/or unequal average diameters; wherein said openings, pores, through-going conduits and/or gaps comprise a round, or angular cross section or a cross section formed by a mixture of round and angular structure elements.

14. Desmear module according to claim 11 characterized in that the average diameter of said openings, pores, through-going conduits and/or gaps in each separating element is continuously increasing from the bottom of the desmear container up to the absolute height above the treatment liquid level inside of the desmear module.

15. Desmear module according to claim 10 characterized in that the second separating element is identical to the first separating element.

16. Desmear module according to claim 15 characterized in that the desmear module comprises at least a first and/or at least a first and a second separating element each having a plurality of openings, pores, through-going conduits and/or gaps.

17. Desmear module according to claim 16 characterized in that the plurality of openings, pores, through-going conduit, gaps or combination thereof have a nonhomogeneous distribution in the both the first separating element and the second separating element.

18. Desmear module according to claim 17 characterized in that the plurality of openings, pores, through-going conduits, gaps or combination thereof in both the first separating element and the second separating element have equal or unequal average diameters; wherein said openings, pores, through-going conduits, gaps or combination thereof comprise a round, or angular cross section, or a cross section formed by a mixture of round and angular structure elements.

19. Desmear module according to claim 17 characterized in that the average diameter of said openings, pores, through-going conduits and/or gaps in each separating element is continuously increasing from the bottom of the desmear container up to the absolute height above the treatment liquid level inside of the desmear module.

* * * * *